(12) United States Patent
Huang et al.

(10) Patent No.: US 7,983,013 B2
(45) Date of Patent: Jul. 19, 2011

(54) OPERATING AND CONTROLLING INSULATED GATE BIPOLAR TRANSISTORS IN HIGH SPEED FAILURE MODE SITUATIONS

(75) Inventors: Fengtai Huang, Northville, MI (US); Bryan Ludwig, West Bloomfield, MI (US); Fred Flett, Bloomfield, MI (US); Subramanian S. Vadula, Novi, MI (US); Lizhi Zhu, Canton, MI (US); Richard J. Hampo, Plymouth, MI (US)

(73) Assignee: Continantal Automotive Systems US, Inc., Auburn Hills, MI (US)

( * ) Notice: Subject to any disclaimer, the term of this patent is extended or adjusted under 35 U.S.C. 154(b) by 527 days.

(21) Appl. No.: 11/947,272

(22) Filed: Nov. 29, 2007

(65) Prior Publication Data

US 2009/0067109 A1   Mar. 12, 2009

Related U.S. Application Data

(60) Provisional application No. 60/867,753, filed on Nov. 29, 2006.

(51) Int. Cl.
*H02H 3/08*   (2006.01)
*H02H 9/02*   (2006.01)
(52) U.S. Cl. ..................................... 361/93.1
(58) Field of Classification Search ................. 361/93.1, 361/94
See application file for complete search history.

(56) References Cited

U.S. PATENT DOCUMENTS

| 5,467,242 | A | * | 11/1995 | Kiraly ............................. 361/94 |
| 5,926,012 | A | | 7/1999 | Takizawa et al. |
| 6,097,582 | A | * | 8/2000 | John et al. ....................... 361/79 |
| 2002/0176215 | A1 | | 11/2002 | Hiyama et al. |

FOREIGN PATENT DOCUMENTS

| DE | 3539646 | 5/1987 |
| DE | 19741391 A1 | 3/1998 |
| DE | 19913455 | 10/2000 |
| DE | 10031778 | 1/2002 |
| DE | 10158790 B4 | 12/2002 |

OTHER PUBLICATIONS

International Search Report and Written Opinion dated May 14, 2008, PCT/US2007/085867.
Schwarzer et al., "Design and Implementation of a Driver Board for a High Power and High Frequency IGBT Inverter", vol. 4., Jun. 23, 2002, pp. 1907-1912, XP010596027, ISBN: 978-0-7803-7262-7.
Eckel H-G et al., "Optimization of the Turn-Off Performance of IGBT at Overcurrent and Short Circuit Current" Jan. 1, 1993, pp. 317-322, XP006511564.

* cited by examiner

*Primary Examiner* — Ronald W Leja

(57) ABSTRACT

A circuit and method to provide dynamic fault protection to transistors are disclosed. The fault protection may be particularly suited for protecting insulated gate bipolar transistors (IGBTs).

12 Claims, 4 Drawing Sheets

OPERATING AND CONTROLLING INSULATED GATE BIPOLAR TRANSISTORS IN HIGH SPEED FAILURE MODE SITUATIONS

CROSS REFERENCE TO RELATED APPLICATION

The application claims priority to U.S. Provisional Application No. 60/867,753 which was filed on Nov. 29, 2006.

BACKGROUND OF THE INVENTION

1. Field of the Invention

The present disclosure relates to a method and apparatus of operating a transistor.

2. Description of the Related Art

The Insulated Gate Bipolar Transistor (IGBT) has found recent application in power modules in electric drives in electric, fuel cell, gasoline/electric hybrid and fuel cell/electric hybrid vehicles, amongst other areas. One aspect of critical importance in electric drives in such applications is the power density. Therefore, electric drives are often designed with the highest power density possible. IGBT chips used in these modules are often, therefore, operated under extreme conditions including high junction temperature, very fast switching speeds and high voltage and current ratings. With IGBTs operated at such extreme conditions, the fault response time with traditional IGBT fault protection approaches, for example, Vce sensing, is not fast enough.

Under switching operation known in the art, the IGBT gate is driven by a pair of power transistors where the bases of the power transistors are controlled with a local controller. A typical output stage of a conventional IGBT gate driven circuit configuration is illustrated in FIG. 1.

Under a fault condition, such as a shoot through fault, the potential between the collector and the emitter of the IGBT (Vce) will be high. The high potential Vce during switching ON triggers a desaturation fault condition in the local controller. In response, the local controller softly turns OFF the IGBT and sends a fault signal to a system controller.

Current third-generation IGBTs have extremely high current ratings (e.g., up to 1000 A), low saturation voltages (e.g., one to two volts), and very fast switching times (e.g., less then a few hundred nanoseconds). Therefore, use of conventional gate drive circuitry with third generation IGBTs creates problems including poor response time upon fault, poor control of shoot through current and poor control of voltage overshoot at turn off.

For example, with conventional IGBT fault control approaches, the fault signal is sensed through the local collector of the IGBT, where the sensed voltage is compared with a preset voltage. If the sensed voltage is higher then this preset voltage, a timer starts which is usually done with a capacitor charging mechanism. Common practice is to set the timer at a few microseconds. When the time is up, the local controller softly shuts the IGBT OFF. Recently developed third generation IGBTs with high current ratings and high switching speeds cannot wait a few microseconds once a fault occurs; the protection must be activated within a few hundred nanoseconds.

IGBT fault protection approaches recently described involve Vce sensing through a desaturation diode. There are two main issues associated with this approach: delayed fault detection due to blanking time required for noise rejection; and lack of dynamic feedback information provided (e.g., only logic two states exist: fault or not fault).

Since the Vce signal is extremely noisy, blanking time is usually used to reject the noise from normal switching transient. For high performance power modules, dynamic feedback information is desirable to control the fault state effectively. To compensate for the lack of dynamic feedback information associated with Vce sensing, conventional approaches make use of a second feedback loop to monitor the collector current. A different fault detection approach that does not employ Vce sensing has been disclosed where gate voltage is the only parameter sensed and controlled. This approach may not be suitable for high performance IGBT modules where fast detection and dynamic control is required. Existing IGBT fault protection approaches that sense a change in current with respect to time (di/dt) are limited to sensing di/dt by measuring the voltage across the stray inductance where the measured voltage is then compared with a threshold. However, the outcome is still a logic state: fault or not fault; hence no dynamic control is involved.

For applications involving high performance IGBTs, dynamic fault information may be particularly beneficial. Therefore, there remains a need in the art for an approach to IGBT control that addresses these issues. The present disclosure addresses these needs and provides associated benefits.

BRIEF SUMMARY OF THE INVENTION

A fault protection circuit with dynamic control is disclosed.

In some embodiments, a system to control operation of transistors includes means for detecting a fault state of a transistor; and means for dynamically controlling a rate of change in a fault current based at least in part on the fault state. The transistor may, for example, take the form of an insulated gate bipolar transistor and the means for detecting a fault state of a transistor may include a circuit responsive to an induced voltage across a stray inductance between a Kelvin emitter and a power emitter of the insulated gate bipolar transistor. The means for detecting a fault state of a transistor includes a circuit responsive to a magnitude and a duration of a change in current with respect to time. The means for detecting a fault state of a transistor may include a circuit responsive to a magnitude and a duration of a change in current with respect to time. The means for dynamically controlling a rate of change in a fault current based at least in part on the fault state a circuit may includes means for turning OFF the transistor at a slower rate than a conventional rate.

In some embodiments, a method to control operation of transistors includes detecting a fault state of a transistor; and dynamically controlling a rate of change in a fault current based at least in part on the fault state. The transistor may take the form of an insulated gate bipolar transistor and detecting a fault state of a transistor may include detecting an induced voltage across a stray inductance between a Kelvin emitter and a power emitter of the insulated gate bipolar transistor. Detecting a fault state of a transistor may include detecting a magnitude and a duration of a change in current with respect to time. Dynamically controlling a rate of change in a fault current based at least in part on the fault state may include reducing the fault current to a defined level. Dynamically controlling a rate of change in a fault current based at least in part on the fault state may further include turning OFF the transistor at a slower rate than a conventional rate.

BRIEF DESCRIPTION OF THE DRAWINGS

In the figures, identical reference numbers identify similar elements or acts. The sizes and relative positions of elements in the figures are not necessarily drawn to scale and some of these elements are arbitrarily enlarged and positioned to improve figure legibility. Further, the particular shapes of the elements as drawn are not intended to convey any information regarding the actual shape of the particular elements, and have been solely selected for ease of recognition in the figures.

DETAILED DESCRIPTION OF THE INVENTION

Figure 1:
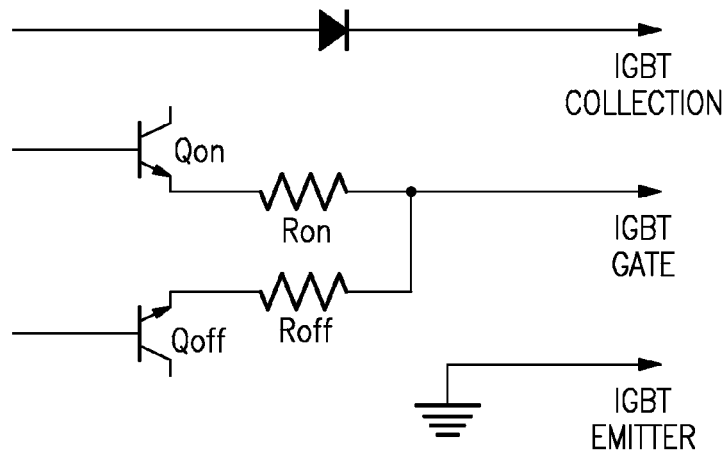
FIG. 1 is an electrical schematic diagram that shows a conventional output stage of IGBT gate drive circuit configuration.

In the following description, certain specific details are set forth in order to provide a thorough understanding of various embodiments. However, one skilled in the art will understand that the invention may be practiced without these details. In other instances, well-known structures have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to."

The headings and Abstract of the Disclosure provided herein are for convenience only and do not interpret the scope or meaning of the claimed invention.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

A disclosed circuit identifies an IGBT fault state by measuring an induced voltage across a stray inductance between an IGBT Kelvin emitter and a power emitter. Upon fault current detection a feedback control dynamically controls a change in fault current over time di/dt. Once the fault current is contained to a threshold level, the disclosed circuit employs a slower than normal turn OFF mechanism.

Fault detection is based on both a magnitude and a duration of the change in current with respect to time di/dt. The disclosed circuit dynamically controls a gate drive voltage through negative feedback. The disclosed circuit turns OFF the IGBT via a different process than that of normal operation.

An IGBT fault protection circuit configuration is disclosed that is based on a change in current with respect to time di/dt instead of a magnitude of a collector-emitter voltage Vce of the IGBT.

The IGBT fault protection circuit senses an induced voltage across stray inductances between an IGBT emitter and a power module emitter. If the sensed induced voltage reaches a threshold level for a threshold time interval, a negative feedback control is activated. The negative feedback control prevents the IGBT current from shooting too high, and provides driving a source for a next control stage—soft turn OFF.

Broadly speaking, a negative feedback control mechanism is used to dynamically control an IGBT fault current. The active state of negative feedback control is sensed through a voltage across a resistor. The active state information is used as a trigger signal to activate a unit that disables the command input, activates the soft turn OFF, and activates a negative feedback shutdown unit. After a delay time, the negative feedback shutdown unit disables the negative feedback control.

For normal IGBT operation, the negative feedback control will not be activated with blanking time set at, for example, 300 ns. This is compared with normal switching time which is less then, for example, 200 ns. Under IGBT fault conditions, the negative feedback control is activated alone first. After a portion of the time constant, the IGBT input command is disabled, the IGBT soft turn OFF is enabled, and a negative feedback shutdown timer is activated. During this period of time, both negative feedback control and soft turn OFF are active. The negative feedback control overrides the soft turn OFF effect on the IGBT gate voltage. Once the negative feedback shutdown timer expires, the negative feedback control shuts down and the IGBT gate is controlled by a soft turn OFF resistor.

Figure 2:
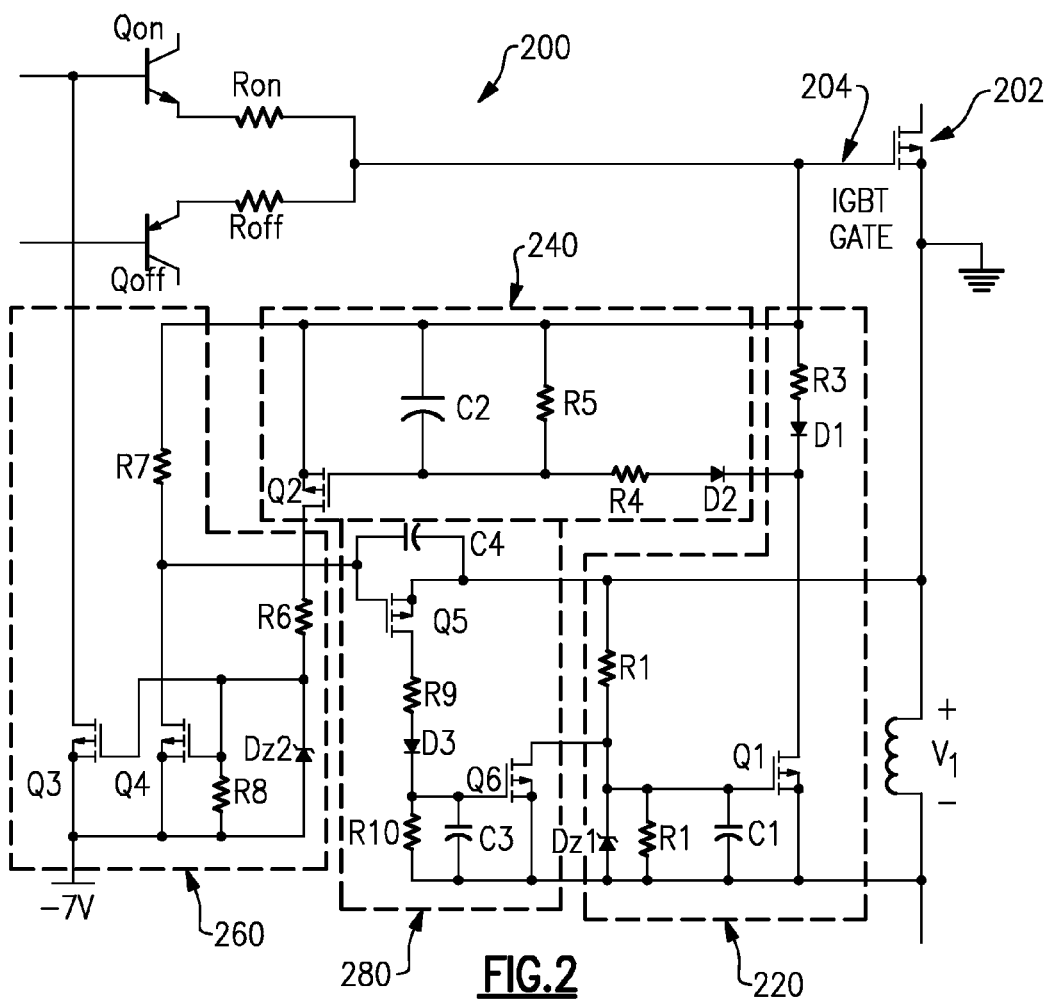
FIG. 2 is an electrical schematic diagram that shows an IGBT fault protection control circuit according to one illustrated embodiment.

FIG. 2 shows an IGBT fault protection control circuit 200 that implements IGBT fault protection for an IGBT 202, according to one illustrated embodiment. The protection circuit 200 includes a pair of power transistors Qon, Qoff, a pair of power resistors Ron, Roff, a negative feedback control unit 220, a feedback trigger and hold unit 240, a command disable and turnoff enable unit 260 and a negative feedback shutdown unit 280. The power transistor Qon is coupled in series with the power resistor Ron and the power transistor Qoff coupled in series with power resistor Roff. The power transistor Qon and power resister Ron are coupled in parallel with the power transistor Qoff and the power resistor Roff.

The negative feedback control unit 220 is coupled to the induced voltage across the stray inductance. If the sensed reduced voltage is above both a threshold in magnitude and a threshold in duration, the negative feedback control 220 is activated. Once activated, the negative feedback control unit 220 dynamically controls the IGBT gate 204 and provides a driving source for the feedback trigger and hold unit 240. The feedback trigger and hold unit 240 senses and holds information indicative of an operational state (e.g., active, not active) of the negative feedback control unit 220. The command disable and turnoff enable unit 260 receives input from the negative feedback trigger and hold unit 240. The output of the command disable and turnoff enable unit 260 disables the command output and connects a soft turn OFF resistor R7 between the IGBT gate 204 and the return (−7V, for example). The input of the negative feedback shutdown unit 280 is from the output of the command disable and turnoff enable unit 260. The negative feedback shutdown unit 280, shuts down the negative feedback control unit 220 after a period of time to turn or switch the IGBT OFF via resistor R7.

Negative Feedback Control Unit

In one embodiment, the negative feedback and control unit 220 includes a resistor R1, a Zener diode Dz1, a capacitor C1, a transistor Q1, a resistor R2, a diode D1 and a resistor R3. The negative feedback and control unit 220 is coupled to the IGBT gate 204 and the feedback trigger and hold unit 240. The negative feedback and control unit 220 senses induced voltage across stray inductance V1, creates a blanking time to prevent the protection circuit 200 from acting during normal operation, dynamically controls the IGBT gate voltage under fault condition and provides a trigger signal when activated.

The negative feedback and control unit 220 achieves the first two functions (i.e., sensing the induced voltage across stray inductance and creating a blanking time to prevent the protection circuit 200 from acting during normal operation) by coupling an RC network across the stray inductance. The RC network includes a resistor R2 coupled in parallel with a capacitor C1 and connected in series with a resistor R1. The time constant of the RC network sets the blanking time. The value of the time constant is set such that under the fault condition, the minimum voltage across R2 is higher then the threshold of the transistor Q1.

The negative feedback and control unit 220 realizes the dynamic control function by operating the transistor Q1 in its linear range. The switch ON transient time for normal operation of a typical third generation IGBT may, for example, be in the range of 100 ns to 200 ns. The time constant of the RC network is defined by the values of the resistors R1, R2 and the capacitor C1 and given by the equation:

$$\text{Time Constant} = C1\left(\frac{R1\,R2}{R1+R2}\right)$$

The values may be set such that the voltage charged to capacitor C1 is less than the threshold of transistor Q1 during normal switching transient. If the induced voltage V1 is positive and lasts for more than the time constant, capacitor C1 will be charged to the value set by resistors R1, R2, that is above the threshold of transistor Q1. Therefore, transistor Q1 will turn ON. Zener diode Dz1 prevents an over voltage condition in the gate of transistor Q1. In other words, if the voltage of capacitor C1 across the gate of transistor Q1 is charged to the threshold of transistor Q1, transistor Q1 turns ON. This discharges the IGBT gate 204 and the IGBT current rising rate decreases. Consequently, the available feedback back voltage across the gate of the transistor Q1 is reduced and the transistor Q1 drains less current from the IGBT gate 204. The detection of an active state of the negative feedback control is realized by sensing the voltage across the resistor R3 and the diode D1 coupled in series. The resistor R3, diode D1 and transistor Q1 provide a path to dynamically control the gate voltage of the IGBT 202. The degree of di/dt control is adjusted with the value of resistor R3. The information indicative of the operational state (e.g., active) of the di/dt control is indicated with the voltage across the resistor R3 and the diode D1. This voltage serves as an input to the feedback trigger and hold unit 240 which is coupled across resistor R3 and diode D1. The diode D1 blocks reverse current flow when the induced voltage V1 is negative.

In one embodiment, for example, the resistor R1 may be 600Ω, capacitor C1 may be 2 nF, resistor R2 may be 150Ω, and resistor R3 may be 2Ω however, a person of ordinary skill in the art may readily choose values suitable for a particular application.

In one embodiment, the feedback trigger and hold unit 240 includes a pair of resistors R4, R5, a capacitor C2, a transistor Q2 and a diode D2. The feedback trigger and hold unit 240 is coupled to the negative feedback control unit 220 and the command disable and turnoff enable unit 260. The feedback trigger and hold unit 240 receives the voltage across the resistor R3 and diode D1 of the negative feedback control unit 220 indicating the operational state of the negative feedback control unit 220 is active. The input voltage is applied to a second RC network comprised of a resistor R4 and capacitor C2. Once the capacitor C2 voltage reaches the threshold of the transistor Q2, the transistor Q2 conducts. The diode D2 blocks the discharge path, thus the transistor Q2 continues to conduct even if the input is lost. The conduction by the second transistor Q2 is held with a time constant set via a resistor R5 and capacitor C2. This time constant set to be longer than the total IGBT fault protection process time which may be 1 to 10 microseconds, for example. This keeps the soft turn OFF active after negative feedback control unit 220 becomes inactive. The output of the feedback trigger and hold unit 240 charges the gate of the command disable and turnoff enable unit 260.

In one embodiment, for example, the resistor R4 may be 100Ω and resistor R5 may be 10 kΩ however, a person of ordinary skill in the art may readily choose suitable values for a particular application.

Command Disable and Turnoff Enable Unit

In one embodiment, the command disable and turnoff enable unit 260 includes a pair of transistors Q3, Q4, resistors R6, R7, R8 and Zener diode Dz2.

The command disable and turnoff enable unit 260 is coupled to the feedback trigger and hold unit 240 and the negative feedback shutdown unit 280. The command disable and turnoff enable unit 260 receives input from the feedback trigger and hold unit 240. The output of the command disable and turnoff enable unit 260 has three functions: disable the command input, enable the soft turn OFF and send a trigger signal to the negative feedback shutdown unit 280. Once the gate of the transistor Q3 is charged to its threshold by the output of the feedback trigger and hold unit 240, the transistor Q3 pulls down the base of the first power transistor Qon, disabling the command input, and the transistor Q4 pulls down the IGBT gate 204 through resistor the R7. The output of the transistor Q4 activates the input of the negative feedback shutdown unit 280. The resistor R8 keeps the gate of the transistor Q3 and the transistor Q4 discharged during normal operation. The Zener diode Dz2 clamps the gate of the transistor Q3 and the transistor Q4 to prevent transient over voltage conditions.

In one embodiment, for example, resistors R6, R7 R8 may be 1 kΩ, 65Ω and 10 kΩ respectfully however, a person of ordinary skill in the art may readily choose values for resistors R6, R7, R8 that are suitable to a particular application.

Negative Feedback Shutdown Unit

In one embodiment, the negative feedback shutdown unit 280 includes a pair of resistors R9, R10, a pair of capacitors C3, C4, a diode D3 and a pair of transistors Q5, Q6. The signal from the transistor Q4 is first inverted from active low with reference to low power potential to active high with reference to the power emitted by the transistor Q5. The time constant of the RC network formed by resistors R9, R10 and capacitor C3 is set such that the time required to charge capacitor C3 to the threshold of the transistor Q6 is the same as the time required for di/dt control process to be completed. The conduction by the transistor Q6 discharges the gate of the transistor Q1 and terminates the di/dt control process.

For example, the time required for the di/dt control process to complete may be about 0.5 microseconds and the resistors R9, R10 may have values 1 kΩ and 10 kΩ respectfully. Capacitor C3 may have a value of 1 nF. However, a person of ordinary skill in the art may readily choose suitable values for a particular application.

In general, there are two timing concerns that need to be addressed: a) the time from di/dt control being activated to the time that the command signal is disabled, and b) the time from soft turn OFF being activated to the time di/dt control is shut down. The time from di/dt control being activated to the time the command signal is disabled is mainly determined by the time constant given by the product of the value of resistor R4 and capacitor C2, the threshold of transistor Q2, and the voltage across resistor R3. During this time the di/dt control mechanism handles both the discharge current from the IGBT gate 204 and the normal gate drive current through the first power transistor Qon and the power resistor Ron. The voltage increase across resistor R3 due to the additional current from the first power transistor Qon and the power resistor Ron is compensated with a decrease of drain source voltage Vds of the transistor Q1. Therefore, the delay of the command signal being disabled has minimum effect on the di/dt control. The time from the soft turn OFF being activated to the time di/dt control is shut down is determined with the turn ON time of the transistor Q5, the time constant being given by the product of the values of the resistor R9 and capacitor C3, the threshold of the transistor Q6 and the induced voltage V1. During this time, the IGBT gate 204 has two discharge paths—the di/dt control and the soft turn OFF. The soft turn OFF circuit speeds up the discharge of the IGBT gate 204.

EXAMPLES

The effectiveness of the IGBT fault protection circuit 200 was validated with power modules using Infineon brand 3rd generation IGBT chips model SIGC100T60R3 rated at 600V and 1000 A. The validation was conducted on 100 kW electric drive systems for fuel cell powered electric vehicles. In the graphs discussed below, IGBT1 refers to the transistor illustrated in the previous Figures which is experiencing the fault condition, while IGBT2 refers to a transistor of an test apparatus which is employed to create or initiate a shoot through fault condition on IGBT1 to test the dynamic protection circuit and method.

Figure 3A:
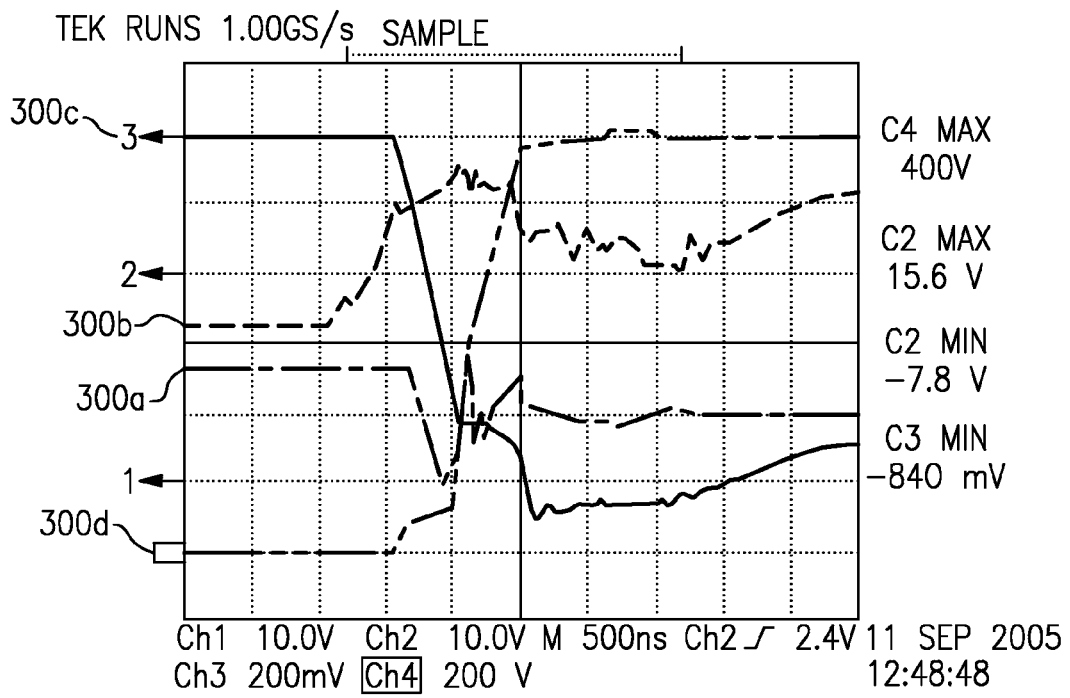
FIG. 3A is a graph that shows a plot of voltage versus time for shoot through fault test results at 400 VDC.

FIG. 3A is a graph of voltage versus time for shoot through fault test results at 400 VDC showing a gate voltage Vg of IGBT2 300a, a gate voltage Vg IGBT1 300b, the collector current (5 kA/V) 300c and Vce 300d.

Figure 3B:
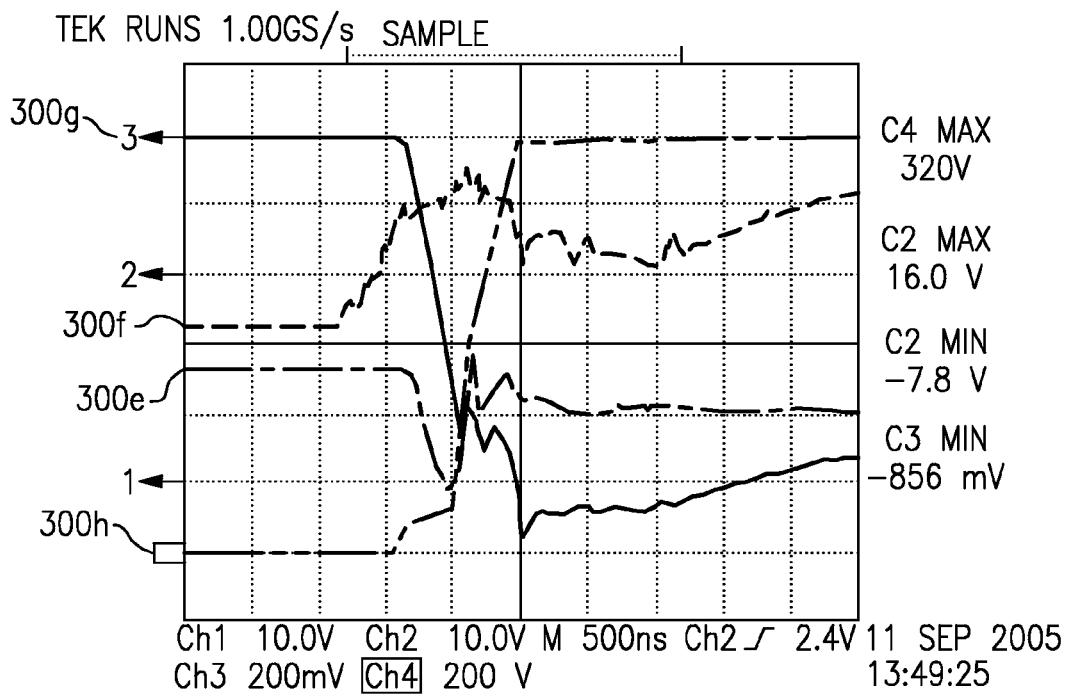
FIG. 3B is a graph that shows a plot of voltage versus time for shoot through fault test results at 430 VDC.

FIG. 3B is graph of voltage versus time for shoot through fault test results at 430 VDC showing a gate voltage Vg of IGBT2 300e, a gate voltage Vg of IGBT1 300f, the collector current (5 kA/V) 300g and Vce 300h.

Figure 4A:
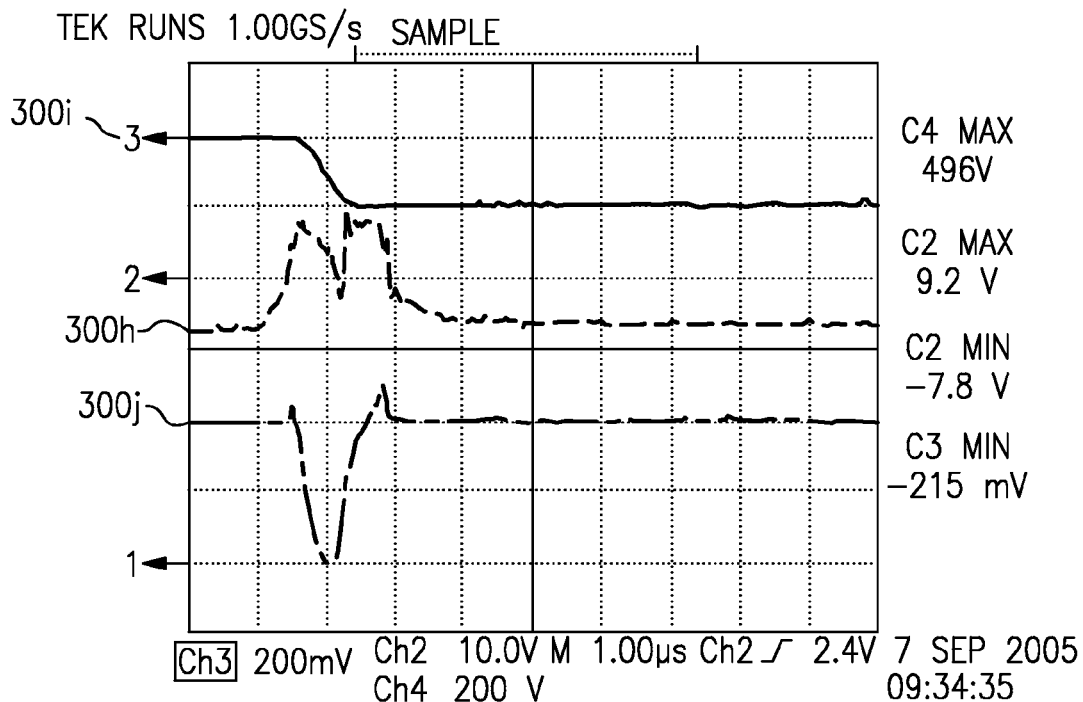
FIG. 4A is a graph that shows a plot of voltage versus time for short circuit test results at 400 VDC.

FIG. 4A is a graph of voltage versus time for short circuit test results at 400 VDC showing a gate voltage Vg 300i, a collector current (5 kA/V) 300j and a collector-emitter voltage Vce 300k.

Figure 4B:
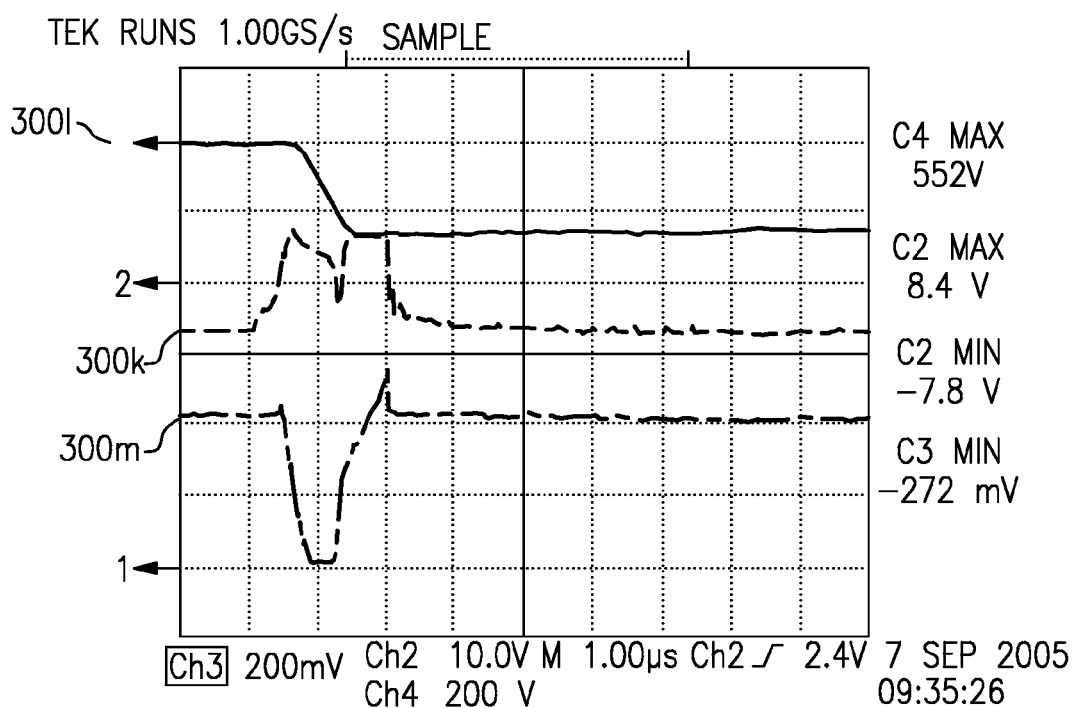
FIG. 4B is a graph that shows a plot of voltage versus time for short circuit fault test results at 430 VDC.

FIG. 4B is a graph of voltage versus time for short circuit fault test results at 430 VDC showing a gate voltage Vg 300l, a collector current (5 kA/V) 300m and collector-emitter current Vce 300n.

Figure 5A:
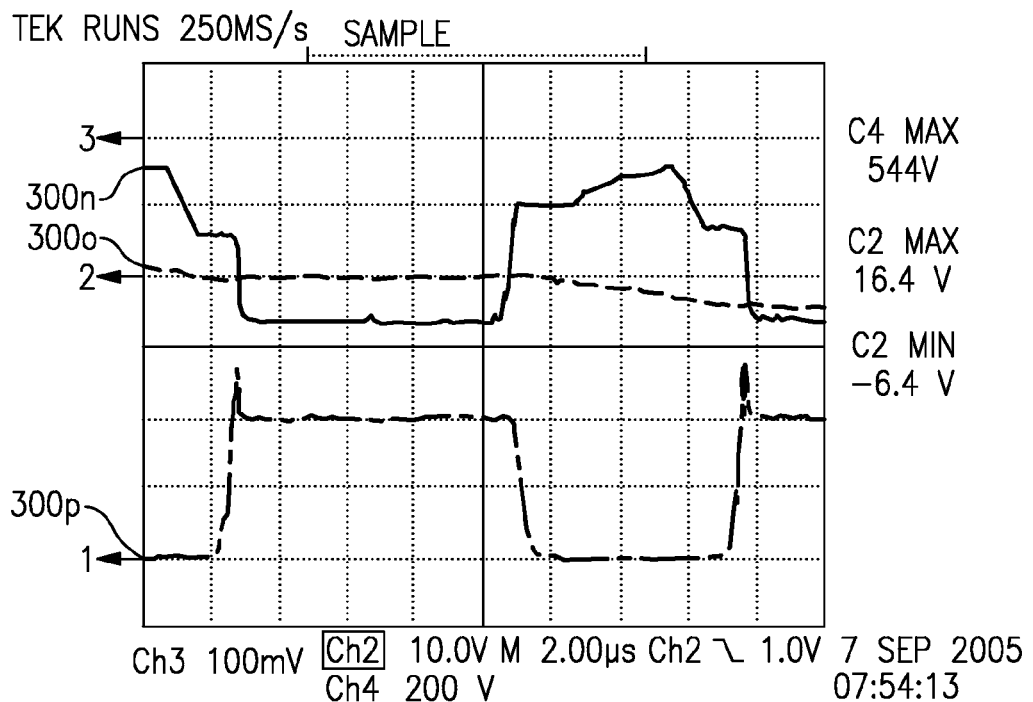
FIG. 5A is a graph that shows a plot of voltage versus time for double pulse fault test results at 400 VDC.

FIG. 5A is a graph of voltage versus time for double pulse fault test results at 400 VDC showing a gate voltage Vg 300o, a collector current (5 kA/V) 300p and a collector-emitter voltage Vce 300q.

Figure 5B:
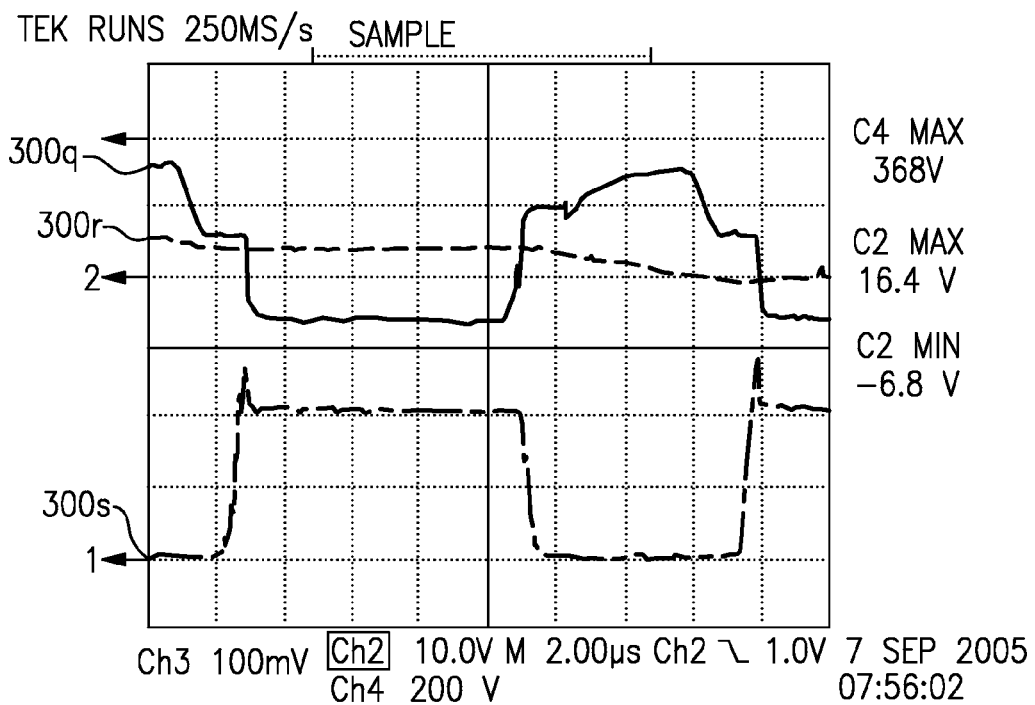
FIG. 5B is a graph that shows a plot of voltage versus time for double pulse fault test results at 430 VDC.

FIG. 5B is a graph of voltage versus time for double pulse fault test results at 430 VDC showing a gate voltage VG 300r, a collector current (5 kA/V) 300s and a collector-emitter voltage Vce 300t.

The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art. The teachings provided herein of the various embodiments can be applied to other transistor circuits, not necessarily the exemplary IGBT transistor circuit generally described above.

For instance, the foregoing detailed description has set forth various embodiments of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one embodiment, the present subject matter may be implemented via discrete electrical components. In other embodiments, portions of the present subject matter may be implemented in Application Specific Integrated Circuits (ASICs), microprocessors, digital signal processors or other controllers.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A system to control operation of an insulated gate bipolar transistor, the system comprising:
 a detector for detecting a fault state of an insulated gate bipolar transistor (IGBT), the detector including a circuit responsive to an induced voltage across a stray inductance; and
 a controller including a first stage and a second stage for controlling and shutting off the IGBT responsive to detection of a fault state, the first stage comprising a negative feedback control unit that is coupled to the induced voltage across the stray inductance and that dynamically controls a rate of change in a fault current based in part on the fault state of the IGBT of the circuit, wherein the induced voltage across the stray inductance is between a Kelvin emitter and a power emitter of the insulated gate bipolar transistor.

2. The system of claim 1, wherein the first stage controls a rate of change in a fault current for a first interval, and the second stage turns off the IGBT upon expiration of the first interval.

3. The system of claim 1 wherein the detector includes a circuit responsive to a magnitude and a duration of a change in current with respect to time.

4. The system of claim 1 wherein the first stage dynamically controls a rate of change in a fault current based at least in part on the fault state of a circuit and the second stage turns OFF the IGBT at a slower rate than a conventional rate.

5. The system as recited in claim 4, wherein the rate of change in the fault current is substantially linear.

6. The system of claim 1, wherein the negative feedback control unit is coupled to a resistor capacitor (RC) network across the stray inductance.

7. The system of claim 6, wherein the negative feedback control unit dynamically controls a rate of change in the fault current by operating a transistor in a linear range.

8. A method to control operation of Insulated Gate Bipolar transistor (IGBT), the method including the steps of:
   detecting a fault state of a transistor with a circuit responsive to an induced voltage across a stray inductance;
   dynamically controlling a rate of change in a fault current based at least in part on the fault state for a first interval; and
   turning off the IGBT at a desired rate upon expiration of the first interval, wherein the step of detecting the fault state includes detecting the induced voltage across the stray inductance between a Kelvin emitter and a power emitter of the IGBT.

9. The method of claim 8 wherein detecting a fault state of the IGBT includes detecting a magnitude and a duration of a change in current with respect to time.

10. The method of claim 8 wherein dynamically controlling a rate of change in a fault current based at least in part on the fault state includes reducing the fault current to a defined level.

11. The method of claim 8, wherein the rate of change in a fault current is controlled to provide a linear reduction in fault current to a defined level.

12. The system of claim 8 wherein dynamically controlling a rate of change in a fault current based at least in part on the fault state further includes turning OFF the transistor at a slower rate than a conventional rate.

\* \* \* \* \*